(12) United States Patent
Chen et al.

(10) Patent No.: US 9,170,491 B2
(45) Date of Patent: Oct. 27, 2015

(54) NEGATIVE-TYPE PHOTORESIST COMPOSITION FOR THICK FILM AND USE THEREOF

(71) Applicant: Everlight Chemical Industrial Corporation, Taipei (TW)

(72) Inventors: Yi Jing Chen, Taoyuan County (TW); Nai Tien Chou, Taoyuan County (TW); Hsin Yi Huang, Taoyuan County (TW); Yen-Cheng Li, Taoyuan (TW)

(73) Assignee: EVERLIGHT CHEMICAL INDUSTRIAL CORPORATION, Taipei (TW)

( * ) Notice: Subject to any disclaimer, the term of this patent is extended or adjusted under 35 U.S.C. 154(b) by 0 days.

(21) Appl. No.: 14/222,928

(22) Filed: Mar. 24, 2014

(65) Prior Publication Data

US 2015/0118617 A1  Apr. 30, 2015

(30) Foreign Application Priority Data

Oct. 25, 2013 (TW) .............................. 102138621 A

(51) Int. Cl.
*G03F 7/027* (2006.01)
*G03F 7/038* (2006.01)

(52) U.S. Cl.
CPC .............. *G03F 7/0388* (2013.01); *G03F 7/027* (2013.01); *Y10S 430/111* (2013.01); *Y10S 430/114* (2013.01)

(58) Field of Classification Search
CPC ..... G03F 7/027; G03F 7/033; Y10S 430/111; Y10S 430/114; Y10S 430/128
USPC ................ 430/270.1, 281.1, 913, 927, 285.1; 522/102
See application file for complete search history.

(56) References Cited

U.S. PATENT DOCUMENTS

| 5,723,262 A * | 3/1998 | Nakamura et al. .......... 430/286.1 |
| 5,948,514 A * | 9/1999 | Komori et al. ................ 428/209 |
| 8,092,981 B2 * | 1/2012 | Kang et al. ................. 430/285.1 |
| 2005/0260523 A1 * | 11/2005 | Juan et al. .................. 430/270.1 |

FOREIGN PATENT DOCUMENTS

JP         2012123283 A  *  6/2012

* cited by examiner

*Primary Examiner* — Amanda C Walke
(74) *Attorney, Agent, or Firm* — Bacon & Thomas, PLLC

(57) ABSTRACT

The present invention relates to a negative-type photoresist composition for thick film, comprising: (A) 20 to 50 wt % of an alkali-soluble resin which is polymerized from a plurality of kinds of monomers, wherein the monomers includes compounds represented by formulas (1A) and (1B), and based on the weight ratio of the monomers to the alkali-soluble resin, the sum of the formula (1A) compound and the formula (1B) compound are 20 to 60%, and X of the formula (1A) and (1B) may be independently H, methyl or ethyl.

(B) 10 to 30 wt % of crosslinker which can be a bisphenol fluorene derivative monomer having at least one ethylenically unsaturated double bond; (C) 5 to 15 wt % of photo initiator; and (D) residual solvent. The present invention also relates to use of the above-mentioned negative-type photoresist compound for thick film.

9 Claims, 1 Drawing Sheet

NEGATIVE-TYPE PHOTORESIST COMPOSITION FOR THICK FILM AND USE THEREOF

CROSS REFERENCE TO RELATED APPLICATION

This application claims the benefits of the Taiwan Patent Application Serial Number 102138621, filed on Oct. 25, 2013, the subject matter of which is incorporated herein by reference.

BACKGROUND OF THE INVENTION

1. Field of the Invention

The present invention relates to a negative-type photoresist composition for thick film and use thereof. More particularly, the present invention relates to a negative-type photoresist composition for thick film and use thereof for an electroplating process.

2. Description of Related Art

In recent years, with the development of electronic equipment miniaturization, industrial circles have pursued the development of high-density package technology such as multi-pin thin-film packaging and miniaturized packaging.

A photoresist for thick film is a critical material for the semiconductor assembly process mentioned above. For example, it can be used in a bumping process for the formation of bumps or metal terminals by electroplating. However, because electroplating solutions for manufacturing bumps or metal terminals usually include cyanide or non-cyanide, it is hard to maintain the shape of such photoresist during the manufacturing process. Therefore, the deformation or peeling of the photoresist for thick film would easily occur and cause problems such as undesired wire conduction or short circuit. Furthermore, in an electroplating process for a silicon wafer, the adhesion between the photoresist and the substrate should be considered. For example, it should be ascertained whether the photoresist can be easily peeled from the substrate after the electroplating process and whether the adhesion between the photoresist and the substrate can be maintained well during the electroplating process.

Therefore, it would be helpful to develop a photoresist which can be used to a bumping process of silicon wafer and has characteristics such as high photosensitivity, good adhesion with silicon wafer, and high resistance against deformation during electroplating for promoting the development of related industry.

SUMMARY OF THE INVENTION

The object of the present invention is to provide a negative-type photoresist composition for thick film, which can exhibit high photosensitivity, good adhesion with silicon wafer, and high resistance against deformation during electroplating by including an alkali-soluble resin having a rigid structure and a bisphenol fluorene derivatives monomer in such composition. Thus, the negative-type photoresist composition is suitable for a bumping process of a silicon wafer.

To achieve the object, one aspect of the present invention provides a negative-type photoresist composition for thick film, comprising: (A) 20 to 50 wt % of an alkali-soluble resin which may be polymerized from a plurality of kinds of monomers, wherein the monomers may include compounds represented by formulas (1A) and (1B), and based on the weight ratio of the monomers to the alkali-soluble resin, the sum of the formula (1A) compound and the formula (1B) compound may be 20 to 60%, and X of the formulas (1A) and (1B) may be independently H, methyl or ethyl,

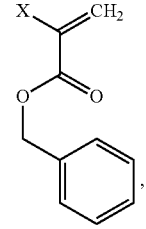

(1A)

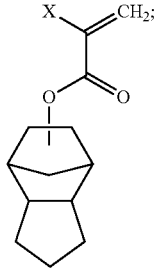

(1B)

(B) 10 to 30 wt % of crosslinker which may be a bisphenol fluorene derivative monomer having at least one ethylenically unsaturated double bond; (C) 5 to 15 wt % of photoinitiator; and (D) residual solvent.

In the above-mentioned negative-type photoresist composition for thick film, in order to regulate the compatibility between (A) the alkali-soluble resin and the other components, the monomers used in the polymerization for the preparation of the alkali-soluble resin may further include another kinds of monomers. For example, in one example of the present invention, the monomers may further include compounds represented by formula (1C), formula (1D), or a combination thereof,

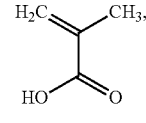

(1C)

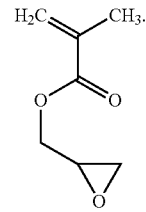

(1D)

In the above-mentioned negative-type photoresist composition for thick film, the alkali-soluble resin may be polymerized by a plurality of kinds of monomers which are represented by formulas (1A), (1B), (1C), and (1D), wherein based on the weight ratio of the monomers to the alkali-soluble resin, the sum of the formula (1A) compound and the formula (1B) compound may be 20 to 60%, the formula (1C) compound may be 10 to 30%, and the formula (1D) compound may be 10 to 20%, and X of the formulas (1A) and (1B) is independently H, methyl or ethyl,

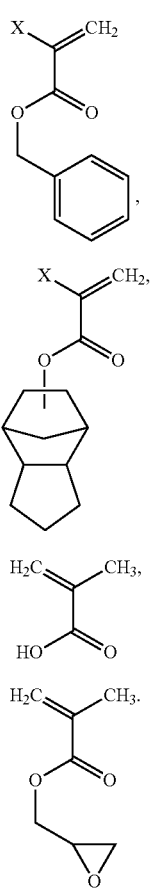

range such as weight average molecular weight, polydispersity index, or acid value. For example, in one example of the present invention, the polydispersity index (PDI) of the alkali-soluble resin may be 1 to 3, and the weight average molecular weight thereof may be 8,000 to 30,000 g/mol. When the weight average molecular weight of the alkali-soluble resin is lower than 8,000 g/mol, the chemical resistance of the alkali-soluble resin may be poor. Thus, the negative-type photoresist composition including the same may not maintain sufficient stability when being applied in a photoresist-related process, resulting in the dissolution or deformation of the photoresist. Otherwise, when the weight average molecular weight of the alkali-soluble resin is higher than 30,000 g/mol, the resolution of the photoresist formed by the negative-type photoresist composition may not achieve a standard required in the process. Therefore, during the preparation of the above-mentioned negative-type photoresist composition, in addition to the consideration of the compatibility between the alkali-soluble resin and the other components, the weight average molecular weight of the resin also may be controlled for the improvement of chemical resistance and resolution of the photoresist manufactured from the negative-type photoresist composition.

In the above-mentioned negative-type photoresist composition for thick film, various kinds of bisphenol fluorene derivative monomers may be used as the component (B) of the above-mentioned negative-type photoresist composition as long as it can be used to the negative-type photoresist composition and has at least one of ethylenically unsaturated double bond for photopolymerization without being specifically limited thereto. For instance, in one example of the present invention, the bisphenol fluorene derivative monomer may be a compound represented by formula (2),

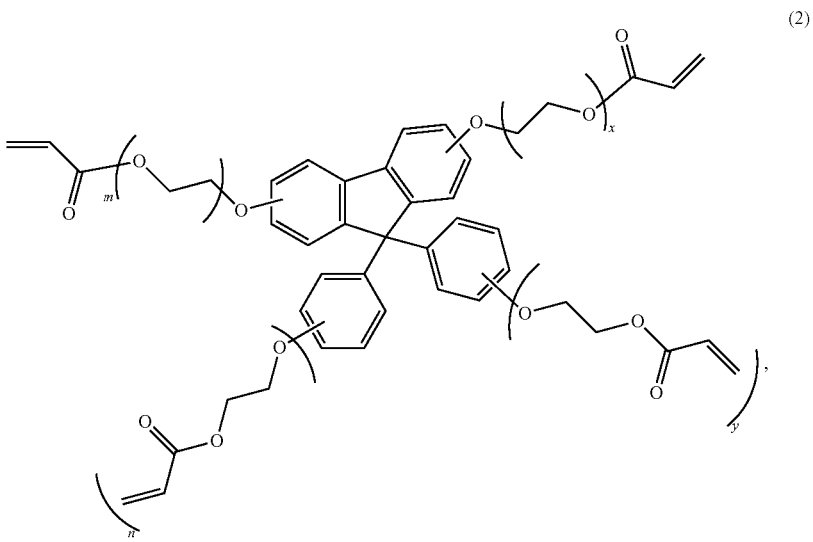

In the above-mentioned negative-type photoresist composition for thick film, in addition to the consideration of the compatibility between the alkali-soluble resin and the other components, it may be good for applying the negative-type photoresist composition by controlling the physiochemical characteristics of the alkali-soluble resin in an appropriate wherein m, n, x and y may be each independently an integer from 0 to 2, and at least one of m, n, x and y may not be 0. In addition, as for another example of the present invention, in the compound represented by the formula (2), m+n+x+y may be 2 or more so that the crosslinking reaction may be efficiently achieved. In particular example of the present invention, the bisphenol fluorene derivative monomer may be ethoxylated bisphenol fluorene diacrylate represented by formula (2A).

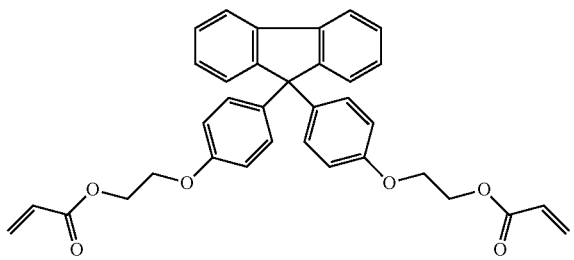

(2A)

Moreover, in the above-mentioned negative-type photoresist composition for thick film, those skilled in the art may also add various kinds of additives according to the required characteristics of the prepared negative-type photoresist composition, but the present invention is not limited thereto. Also, the present invention does not specifically limit the amount range of the additives as long as the required characteristics of the prepared negative-type photoresist composition can be achieved and the above-mentioned negative-type photoresist composition still keep the required characteristics such as good adhesion and resistance against deformation during electroplating. For instance, in one example of the present invention, the negative-type photoresist composition may further comprise larger than 0 to 10 wt % of inhibitor. In another example, the negative-type photoresist composition may further comprise larger than 0 to 10 wt % of adhesion promoter. In yet another example, the negative-type photoresist composition may further comprise lager than 0 to 10 wt % of leveling agent.

In the above-mentioned negative-type photoresist composition for thick film, the component (C) of the present invention may be any known photoinitiator for the negative-type photoresist composition as long as it can initiate a photopolymerization reaction, but the present invention is not specifically limited thereto. For example, the photoinitiator may be, but not limited to: aromatic ketone, p-aminophenone, benzoquinone, benzoin ethers, benzoin, benzyl derivatives, phosphine oxide, and acylphosphine oxide. Such photoinitiators may be used independently or may be a combination including two or more photoinitiators, but the present invention is not limited thereto. Also, the photoinitiator may be selected from anyone of known commercial product or a combination thereof such as Irgacure® 184, Irgacure® 369, Irgacure® 500, Irgacure® 651, Irgacure® 784, Irgacure® 819, Irgacure® 907, Irgacure® 1300, Irgacure® 2010, Irgacure® 2020, Irgacure® 2959, Darocur® 1173, or Darocur® 4265 (produced by Basf), or Chemcure-TPO (produced by Chembridge), but the present invention is not limited thereto.

In the above-mentioned negative-type photoresist composition for thick film, the component (D) of the present invention may be any known solvent for the negative-type photoresist composition as long as the other components can be appropriately dispersed therein, but the present invention is not specifically limited thereto. For example, the solvent may be, but not limited to: hexane, heptane, octane, decane, benzene, toluene, xylene, benzyl alcohol, methyl ethyl ketone, acetone, butanol, ethylene glycol, diethylene glycol, ethylene glycol monomethyl ether, propylene glycol monomethyl ether, 2-methoxybutyl acetate, 2-ethoxybutyl acetate, 4-methoxypentyl acetate, methyl lactate, butyl acetate, propylene glycol monomethyl ether acetate, propylene glycol monoethyl acetate, methyl propionate, methyl benzoate, N,N-dimethylformamide, N-methyl pyrrolidone, tetramethylene sulfoxide, chloroform, or dichloromethane. Such solvents may be used in single or in combination of two or more of them, but the present invention is not limited thereto.

Accordingly, present invention can prepare a negative-type photoresist composition with required characteristics such as high photosensitivity, good adhesion with silicon wafer, and high resistance against deformation.

Another object of the present invention is to provide use of the negative-type photoresist composition for thick film. The negative-type photoresist composition for thick film can be used to prepare a photoresist with high photosensitivity, good adhesion with silicon wafer, and high resistance against deformation during electroplating owing to the alkali-soluble resin having a rigid structure and the bisphenol fluorene derivative monomer included in such composition. Therefore, the photoresist prepared from the above negative-type photoresist composition can be applied in an electroplating process without undesired problems such as deformation, dissolution or peeling off of the photoresist.

To achieve the object, another aspect of the present invention provides a method of using the negative-type photoresist composition for thick film in an electroplating process, which includes a step of using the negative-type photoresist composition for thick film to form a photoresist layer on a substrate to be electroplated.

More specifically, the above-mentioned method of using the negative-type photoresist composition for thick film in an electroplating process can include steps of applying the negative-type photoresist composition on a surface of a substrate such as a silicon wafer surface, and forming a photoresist layer through exposure and development. Then, the substrate with the photoresist layer formed thereon may be subjected to an electroplating process for forming a metal layer (e.g. a wiring layer or bumps) on the surface of the substrate at the region with no photoresist thereon. Finally, the photoresist layer on the surface of the substrate may be stripped by an appropriate treatment.

During the electroplating process for forming the metal layer on the surface of the substrate, the photoresist formed by the negative-type photoresist composition would not encounter the problems of peeling off, deformation or dissolution because the negative-type photoresist composition includes the above-mentioned components. Consequently, the undesired defects such as short circuit can be avoided, and the yield can be improved. Thus, the negative-type photoresist composition of the present invention is suitable for any known electroplating process which requires photoresist such as a bumping process of wafer packaging.

DETAILED DESCRIPTION OF THE PREFERRED EMBODIMENT

Examples 1-9

Figure 1A:
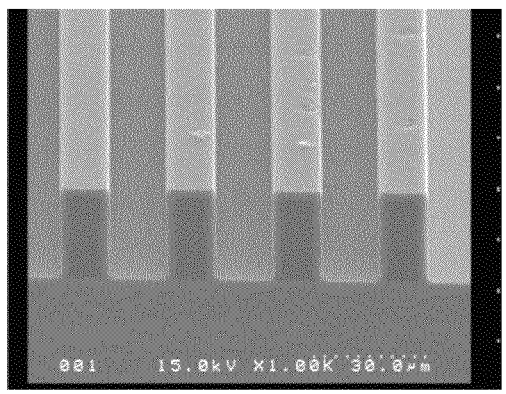
FIG. 1A to 1C are SEM results of Example 1 of the present invention.

With reference to Table 1, negative-type photoresist compositions of Examples 1 to 9 are independently prepared according to the amounts of alkali-soluble resin, crosslinker, photoinitiator, inhibitor, adhesion promoter, leveling agent and solvent shown in Tables 1 and 2. The used alkali-soluble resins are MB211 (benzyl acrylate/tricyclo [5.2.1.0$^{2,6}$]decan-8-ol methacrylate/methacrylic acid/glycidyl methacrylate; BzMA/TCDMA/MAA/MAA-GMA, Mw≈13000, PDI≈2.55, acid number (AN)≈98 mgKOH/g, produced by Miwon), MB120 (benzyl acrylate/tricyclo [5.2.1.0$^{2,6}$]decan-8-ol methacrylate/methacrylic acid/glycidyl methacrylate; BzMA/TCDMA/MAA/MAA-GMA, Mw≈10000, acid number (AN)≈130 mgKOH/g, produced by Miwon), or BL100 (benzyl acrylate/methacrylic acid/2-hydroxyethyl methacrylate; BzMA/MAA/HEMA, Mw≈10000, acid number (AN) ≈100 mgKOH/g, produced by Delta Synthetic Co., Ltd). The crosslinkers are ethoxylated bisphenol fluorene diacrylate and its derivatives (BPF-022 and BPF-102, produced by HANNONG Chemicals). The photoinitiators are Irgacure® 819, Irgacure® 369 and Chemcure-TPO (produced by Chembridge). The inhibitor is hydroquinone, the adhesion promoter is Z-6011 (produced by DOW CORNING), the leveling agent is R-41 (produced by DIC), and the solvent is propylene glycol monomethyl ether acetate (CAS No. 108-65-6). The amount of each component of each example is shown in Tables 1 and 2.

TABLE 1

| Example | alkali-soluble resin | crosslinker | Photoinitiator |
|---|---|---|---|
| 1 | MB211 | BPF-022 | Irgacure ®819/Chemcure-TPO |
| 2 | MB120 | BPF-022 | Irgacure ®819/Chemcure-TPO |
| 3 | MB120 | BPF-102 | Irgacure ®369/Irgacure ®819 |
| 4 | BL100 | BPF-022 | Irgacure ®369/Irgacure ®819 |
| 5 | BL100 | BPF-102 | Irgacure ®369/Irgacure ®819 |
| 6 | BL100 | BPF-102 | Irgacure ®369/Irgacure ®819 |
| 7 | BL100 | BPF-102 | Irgacure ®369/Irgacure ®819 |
| 8 | BL100 | BPF-102 | Irgacure ®819/Chemcure-TPO |
| 9 | BL100 | BPF-102 | Irgacure ®819/Chemcure-TPO |

TABLE 2

| Example | alkali-soluble resin (wt %) | crosslinker (wt %) | photo initiator (wt %) | inhibitor (ppm) | adhesion promoter (ppm) | leveling agent (ppm) | solvent |
|---|---|---|---|---|---|---|---|
| 1 | 33 | 18 | 2/8 | 500 | 1000 | 1000 | residual |
| 2 | 32 | 19 | 2/6 | 500 | 1000 | 1000 | residual |
| 3 | 30 | 17 | 3/6 | 500 | 1000 | 1000 | residual |
| 4 | 30 | 17 | 2/6 | 500 | 1000 | 1000 | residual |
| 5 | 32 | 17 | 2/6 | 500 | 1000 | 1000 | residual |
| 6 | 30 | 19 | 3/6 | 500 | 1000 | 1000 | residual |
| 7 | 35 | 17 | 3/8 | 500 | 1000 | 1000 | residual |
| 8 | 30 | 18 | 2/8 | 500 | 1000 | 1000 | residual |
| 9 | 30 | 19 | 2/6 | 500 | 1000 | 1000 | residual |

Comparative Example 1

Comparative Example 1 is substantially similar to Example 1, except that a copolymer of methacrylic acid/methyl methacrylate/2-ethylhexyl acrylate (MAA/MMA/2-EHA, 8450-S-40, Mw≈30000, produced by CHARNG RUHN) is used to replace the alkali-soluble resin of Example 1 and pentaerythritol tetraacrylate (EM241, Mw≈352, produced by Eternal) is used to replace BPF-022 as the crosslinker. The other components and the amount thereof are similar to those shown in Example 1.

Comparative Example 2

Comparative Example 2 is substantially similar to Example 1, except that a copolymer of methacrylic acid/methyl methacrylate/2-ethylhexyl acrylate (MAA/MMA/2-EHA, 8450-S-40, Mw≈30000, produced by CHARNG RUHN) is used to replace the alkali-soluble resin of Example 1 and tricyclodecane dimethanol diacrylate (EM2204, produced by Eternal) is used to replace BPF-022 as the crosslinker. The other components and the amount thereof are similar to those shown in Example 1.

Comparative Example 3

Comparative Example 3 is substantially similar to Example 1, except that a copolymer of methacrylic acid/methyl methacrylate/2-ethylhexyl acrylate (MAA/MMA/2-EHA, 8450-S-40, produced by CHARNG RUHN) is used to replace the alkali-soluble resin of Example 1 and DM87A (produced by Double Bond Chemical) is used to replace BPF-022 as the crosslinker. The other components and the amount thereof are similar to those shown in Example 1.

Comparative Example 4

Comparative Example 4 is substantially similar to Example 3, except that a copolymer of methacrylic acid/methyl methacrylate/2-ethylhexyl acrylate (MAA/MMA/2-EHA, 8450-S-40, produced by CHARNG RUHN) is used to replace the alkali-soluble resin of Example 3. The other components and the amount thereof are similar to those shown in Example 3.

Comparative Example 5

Comparative Example 5 is substantially similar to Example 3, except that a copolymer of methacrylic acid/methyl methacrylate/2-ethylhexyl acrylate/glycidyl methacrylate (MAA/MMA/2-EHA/MAA-GMA, 8456-S-40, Mw≈16000, produced by CHARNG RUHN) is used to replace the alkali-soluble resin of Example 3 and pentaerythritol tetraacrylate (EM241, Mw≈352, produced by Eternal) is used to replace BPF-102 as the crosslinker. The other components and the amount thereof are similar to those shown in Example 3.

ELECTROPLATING PROCESS FOR SILICON WAFER

<Sample Preparation>

First, a silicon wafer with a 1000 Å of gold layer thereon is provided as a substrate. The prepared negative-type photoresist compositions of Examples 1 to 9 and Comparative Examples 1 to 5 are separately coated with a thickness of 20 µm on the surface of the substrate, and baked for 5 minutes at 110° C. Then, such negative-type photoresist compositions are exposed by SEIWA-500UV and are developed with 2.38% tetramethylammonium hydroxide (TMAH) at 23° C. for forming photoresist layers, respectively. Finally, such samples are respectively washed by distilled deionized water for 30 seconds at 25° C. Each photoresist layer on the substrate is observed by scanning electron microscopy for evaluating the resolution and residue of the photoresist layers formed by the negative-type photoresist compositions of Examples 1 to 9 and Comparative Examples 1 to 5, respectively.

<Electroplating Process>

The samples prepared by the negative-type photoresist compositions of Examples 1-9 and Comparative Examples 1-5 are respectively dipped into an electroplating solution (cyanide type gold plating solution, produced by WC), and are subjected to an electroplating process with 0.4 current density (A/dm$^2$, Ampere per Square Decimeter (ASD)) for 30 minutes at 60° C. so that a metal layer can be formed on the surface of each substrate at the region without the photoresist layer thereon, respectively. In such experiments, the metal layer is a bump. Finally, such samples are respectively washed by distilled deionized water for 30 seconds at 25° C. After electroplating process, the photoresist layer of each sample is observed by scanning electron microscopy for evaluating the chemical strength of the photoresist layers formed by the negative-type photoresist compositions of Examples 1 to 9 and Comparative Examples 1 to 5, respectively.

The photoresist layer on the surface of each sample is stripped by dipping each sample into N-methyl-2-pyrrolidone (NMP) for 20 minutes at 60° C. Then, such samples are respectively washed by distilled deionized water for 30 seconds at 25° C. The residual photoresist layer on the surface of each sample is observed by scanning electron microscopy for evaluating the stripping of the photoresist.

<Evaluating Results>

Figure 1B:
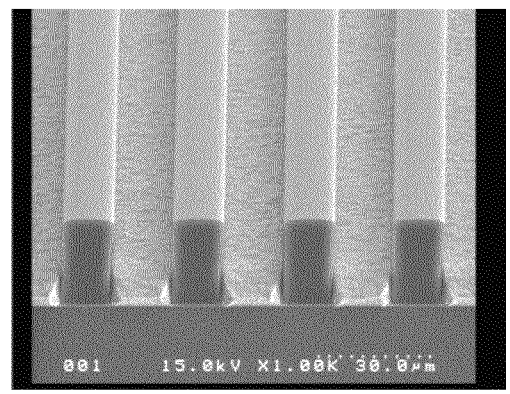
Figure 1C:
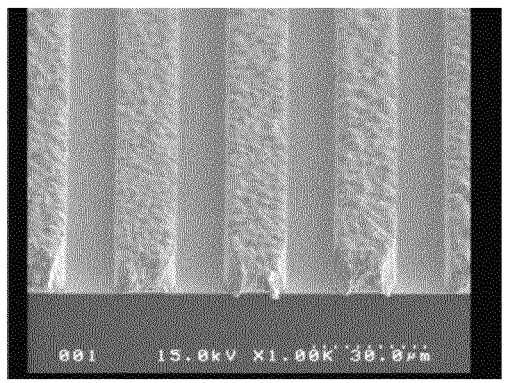

Please refer to Tables 3 and 4. Table 3 shows the evaluating standard of each evaluating item, and Table 4 is the evaluating results of the samples prepared from the negative-type photoresist compositions of Examples 1-9 and Comparative Examples 1-5. The evaluation items include resolution, residue after the development of the photoresist layer, chemical strength of the photoresist layer, and stripping of the photoresist layer in sequence. As shown in Table 4, the negative-type photoresist components of Examples 1-9 and Comparative Examples 1-5 can pass all evaluations. That is, as shown in FIGS. 1A to 1C, the photoresist layer formed by the negative-type photoresist composition of the present invention has excellent resolution (FIG. 1A) and is not peeled off during the electroplating process (FIG. 1B). Also, the photoresist layer can be totally stripped without any residue on the substrate after electroplating process (FIG. 1C).

TABLE 3

| | ○ | X |
|---|---|---|
| resolution | The resolution can reach 15 μm | The resolution cannot reach 15 μm |
| residue | Without residue on the surface of the substrate | With residue on the surface of the substrate |
| chemical strength | Without peeling of the photoresist during the electroplating process | With peeling of the photoresist during the electroplating process |
| strip | Without residue on the substrate | With residue on the substrate |

TABLE 4

| | resolution | residue | chemical strength | strip |
|---|---|---|---|---|
| example 1 | ○ | ○ | ○ | ○ |
| example 2 | ○ | ○ | ○ | ○ |
| example 3 | ○ | ○ | ○ | ○ |
| example 4 | ○ | ○ | ○ | ○ |
| example 5 | ○ | ○ | ○ | ○ |
| example 6 | ○ | ○ | ○ | ○ |
| example 7 | ○ | ○ | ○ | ○ |
| example 8 | ○ | ○ | ○ | ○ |
| example 9 | ○ | ○ | ○ | ○ |
| comparative example 1 | ○ | ○ | X | — |
| comparative example 2 | ○ | X | — | — |
| comparative example 3 | ○ | X | — | — |
| comparative example 4 | ○ | ○ | X | — |
| comparative example 5 | ○ | ○ | X | — |

Although the present invention has been explained in relation to its preferred embodiment, it is to be understood that many other possible modifications and variations can be made without departing from the spirit and scope of the invention as hereinafter claimed.

What is claimed is:

1. A negative-type photoresist composition for thick film, comprising:

(A) 20 to 50 wt% of an alkali-soluble resin which is polymerized from a plurality of kinds of monomers, wherein the monomers include compounds represented by formulas (1A) and (1B), and based on the weight ratio of the monomers to the alkali-soluble resin, the sum of the formula (1A) compound and the formula (1B) compound are 20 to 60%, and X of the formulas (1A) and (1B) is independently H, methyl or ethyl,

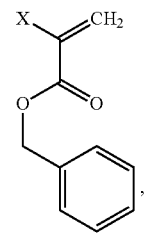

(1A)

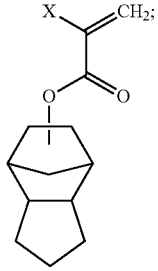

(1B)

(B) 10 to 30 wt% of crosslinker which is a bisphenol fluorene derivative monomer having at least one ethylenically unsaturated double bond;
(C) 5 to 15 wt% of photoinitiator; and
(D) residual solvent.

2. The negative-type photoresist composition for thick film as claimed in claim 1, wherein the monomers further include compounds represented by formula (1C), formula (1D), or a combination thereof,

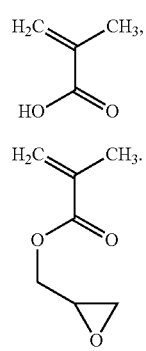
(1C)

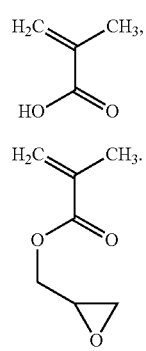
(1D)

3. The negative-type photoresist composition for thick film as claimed in claim 1, wherein the alkali-soluble resin has weight average molecular weight of 8,000 to 30,000 g/mol and polydispersity index of 1 to 3.

4. The negative-type photoresist composition for thick film as claimed in claim 2, wherein the alkali-soluble resin is polymerized by a plurality of kinds of monomers which are represented by formulas (1A), (1B), (10), and (1D), wherein based on the weight ratio of the monomers to the alkali-soluble resin, the sum of the formula (1A) compound and the formula (1B) compound are 20 to 60%, the formula (1C) compound is 10 to 30%, and the formula (1D) compound is 10 to 20%, and X of the formulas (1A) and (1B) is independently H, methyl or ethyl,

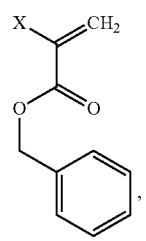
(1A)

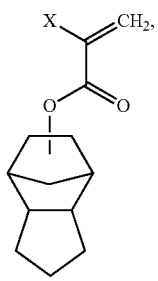
(1B)

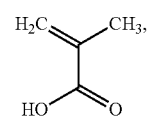
(1C)

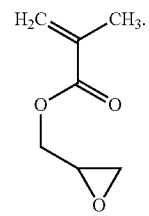
(1D)

5. The negative-type photoresist composition for thick film as claimed in claim 1, wherein the bisphenol fluorene derivative monomer is a compound represented by formula (2),

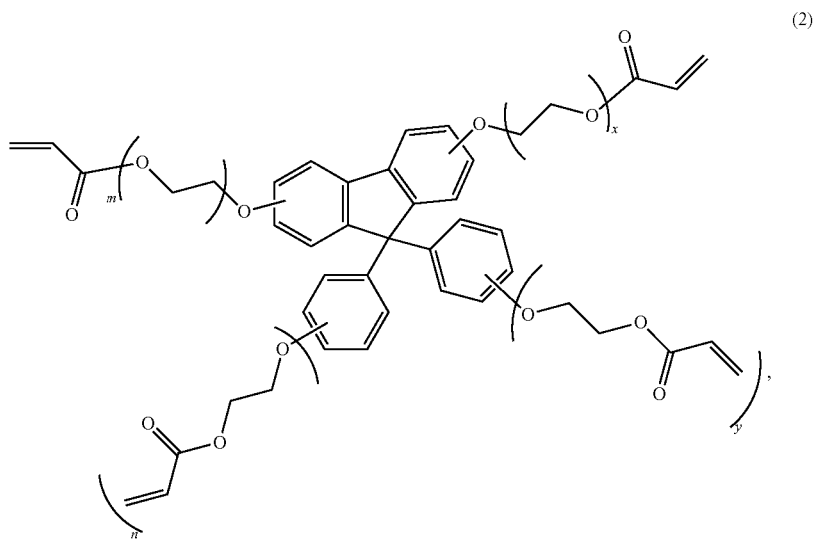
(2)

wherein m, n, x and y are each independently an integer from 0 to 2, and at least one of m, n, x and y is not 0.

6. The negative-type photoresist composition for thick film as claimed in claim 5, wherein m+n+x+y is 2 or more.

7. The negative-type photoresist composition for thick film as claimed in claim 1, further comprising larger than 0 to 10 wt% of inhibitor.

8. The negative-type photoresist composition for thick film as claimed in claim 1, further comprising larger than 0 to 10 wt% of adhesion promoter.

9. The negative-type photoresist composition for thick film as claimed in claim 1, further comprising larger than 0 to 10 wt% of leveling agent.

\* \* \* \* \*